United States Patent
En et al.

[11] Patent Number: 5,990,524
[45] Date of Patent: Nov. 23, 1999

[54] SILICON OXIME SPACER FOR PREVENTING OVER-ETCHING DURING LOCAL INTERCONNECT FORMATION

[75] Inventors: William G. En, Milpitas; Minh Van Ngo, Union City; Chih-Yuh Yang, San Jose; David K. Foote, San Jose; Scott A. Bell, San Jose; Olov B. Karlsson, San Jose; Christopher F. Lyons, Fremont, all of Calif.

[73] Assignee: Advanced Micro Devices, Inc., Sunnyvale, Calif.

[21] Appl. No.: 08/993,868

[22] Filed: Dec. 18, 1997

[51] Int. Cl.$^6$ .................................................. H01L 29/78
[52] U.S. Cl. ........................................... 257/382; 438/639
[58] Field of Search ...................................... 257/344, 382; 438/763, 639

[56] References Cited

U.S. PATENT DOCUMENTS

| | | | |
|---|---|---|---|
| 5,665,993 | 9/1997 | Keller et al. | 257/382 |
| 5,719,079 | 2/1998 | Yoo et al. | 438/238 |
| 5,831,899 | 11/1998 | Wang et al. | 257/382 |

OTHER PUBLICATIONS

T. Ogawa et al., "SiOxNy:H, high performance anti-reflective layer for current and future optical lithography" Journal: Proceeding of the SPIE-The International Society for Optical Engineering vol. 2197 p. 722–32. Jan. 1994.

*Primary Examiner*—Olik Chaudhuri
*Assistant Examiner*—Anh Duy Mai

[57] ABSTRACT

During damascene formation of local interconnects in a semiconductor wafer, a punch-through region can be formed into the substrate as a result of exposing the oxide spacers that are adjacent to a transistor gate to one or more etching plasmas that are used to etch one or more overlying dielectric layers. A punch-through region can damage the transistor circuit. Improved, multipurpose spacers are provided to reduce the chances of over-etching. The multipurpose spacers are made of silicon oxime. The etching plasmas that are used to etch one or more overlying dielectric layers tend to have a higher selectivity ratio to the multipurpose spacers than to the conventional oxide spacers. Additionally, the multipurpose spacers do not tend to degrade the hot carrier injection (HCI) properties as would a typical nitride spacer.

20 Claims, 3 Drawing Sheets

SILICON OXIME SPACER FOR PREVENTING OVER-ETCHING DURING LOCAL INTERCONNECT FORMATION

RELATED APPLICATIONS

This application is related to co-pending application Ser. No. 08/993,148 (Attorney Docket No. 1033-335), filed Dec. 18, 1997 entitled SILICON OXYNITRIDE SPACER FOR PREVENTING OVER-ETCHING DURING LOCAL INTERCONNECT FORMATION.

TECHNICAL FIELD

The present invention relates to semiconductor devices and manufacturing processes, and more particularly to methods and arrangements for preventing over-etching during damascene formation of local interconnects within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a relatively low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as a via or trench that connects the selected regions together. The use of local interconnects reduces the coupling burden on the subsequently formed higher layers to provide such connectivity, which reduces the overall circuit size and as such tends to increase the circuit's performance. Accordingly, as the density of the circuits increase there is a continuing need for more efficient, effective and precise processes for forming smaller local interconnects.

With this in mind, FIG. 1 depicts a cross-section of a portion 10 of a prior-art semiconductor wafer having a stop layer 22 and a dielectric layer 26 as prepared for local interconnect processing using conventional deposition processes. As shown, portion 10 includes a substrate 12 in which one or more devices have been formed. Substrate 12 is typically a doped silicon. Portion 10 includes a gate 16 that is, for example, part of a field effect transistor having a source region 24a and a drain region 24b formed within substrate 12, as is known in the art. Gate 16 is typically a conductive material or a semiconductive material, such as, for example, a doped polycrystalline silicon (referred to hereinafter as polysilicon), which has been formed on a gate oxide 14 (e.g., silicon dioxide $SiO_2$) on top of substrate 12. A spacer 20 has been added to each of the vertical sidewalls of gate 16 and the exposed top surface of gate 16 has a conductive silicide 18 formed thereon. Spacer 20 is typically made of a dielectric material such as silicon dioxide or a similarly deposited oxide material. Stop layer 22, which is also a dielectric material such as silicon nitride ($Si_3N_4$), has been deposited over the exposed surfaces of portion 10 using conventional deposition processes, such as, for example, a chemical vapor deposition (CVD) process or the like. Dielectric layer 26, such as, for example, tetraethlorthosilicate (TEOS) oxide, has been deposited over stop layer 22, also using a conventional deposition processes.

Although stop layer 22 and dielectric layer 26 are both dielectric materials, preferably they are different enough in structure such that subsequent etching processes are capable of etching through dielectric layer 26 while essentially stopping on stop layer 22, thereby avoiding the possibility of etching into substrate 12 and the device regions formed therein. In this manner, stop layer 22 tends to provide improved process control in the formation of local interconnects that are formed using damascene techniques.

The continued shrinkage of the critical dimensions of the various components, layers and film, for example in portion 10 of FIG. 1, places new challenges on those seeking to maintain process control. One of these challenges is to maintain control over the dielectric etching process during local interconnect formation, and in particular effectively stopping on stop layer 22.

To help address this problem improved materials and/or etching processes have been developed, and continue to be developed, so as to increase the selectivity of the dielectric etching process to stop layer 22. Unfortunately, these improvements have yet to lead to a process that exhibits perfect selectivity between the dielectric layer 26 and stop layer 22. Consequently, it is possible to over-etch portions of stop layer 22 and "punch-through" to substrate 12 during the dielectric etching process, especially if stop layer 22 is very thin.

This is especially true for high aspect ratio local interconnect trenches/vias that are formed over a non-planar underlying topology. The high aspect ratios (e.g., a ratio of the trench's height to width) and uneven topology of these types of local interconnects usually requires an etching process that is longer in duration so as to effectively etch away dielectric layer 26. For example, if a local interconnect is formed to electrically connect drain region 24b and gate 16, the corner of gate 16 and the curvature of spacer 20 form an uneven topology. Consequently, during the local interconnect etching process, the newly exposed portions of stop layer 22 over the corner of gate 16 and over spacer 20 will be exposed to the etching materials while the remaining areas of dielectric layer 26 are etched away to reveal substrate 12/drain region 24b. In this example, over-etching and/or punch-through occurs if stop layer 22 is breached during the etching of dielectric layer 26 and spacer 20 is etched wholly or partially away as a result. This problem is exacerbated by further dimensional reductions that tend to further reduce the thickness of stop layer 22 and spacer 20 while increasing the aspect ratio of the local interconnect trench/via Thus, there is a continuing need for improved methods that increase the process control and prevent over-etching during the formation of local interconnects.

SUMMARY OF THE INVENTION

The present invention provides methods that increase the process control during the formation of local interconnects by altering the structure of the gate arrangement of a semiconductor device (e.g., a transistor) so as to prevent possible punch-through into the underlying substrate while forming openings that are used for the local interconnect.

In accordance with one aspect of the present invention, the above stated needs are met by a semiconductor device arrangement that includes a substrate and a gate arrangement. The substrate has a source region and a drain region formed therein. The gate arrangement is formed on the substrate and includes a gate conductor and at least one spacer. The spacer is in contact with the gate conductor and the substrate and is made of silicon oxime.

The above stated needs are further met by a method for forming a semiconductor device having a transistor arrangement and at least one local interconnect. The method includes forming a gate arrangement on a substrate. The gate arrangement has a gate conductor and at least one spacer that contacts the gate conductor and the substrate. The spacer is made of silicon oxime. The method includes forming a source region and a drain region within the substrate, such that at least a portion of the gate arrangement overlaps a portion of the source region and a portion of the drain region. The method further includes forming one or more dielectric layers over the gate arrangement, the source region and the drain region. Then the method includes removing selected portions of dielectric layers to form at least one etched opening that extends through the dielectric layers to expose at least a portion of the underlying source region, drain region, and/or the gate arrangement.

In certain embodiments, the method further includes forming a local interconnect by filling the etched opening with an electrically conductive material, such that the local interconnect electrically contacts the exposed one or more of the underlying source region, drain region and gate arrangement.

In accordance with yet another aspect of the present invention, a multipurpose spacer is provided for use in a semiconductor device. The multipurpose spacer is made of silicon oxime.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

Figure 1:
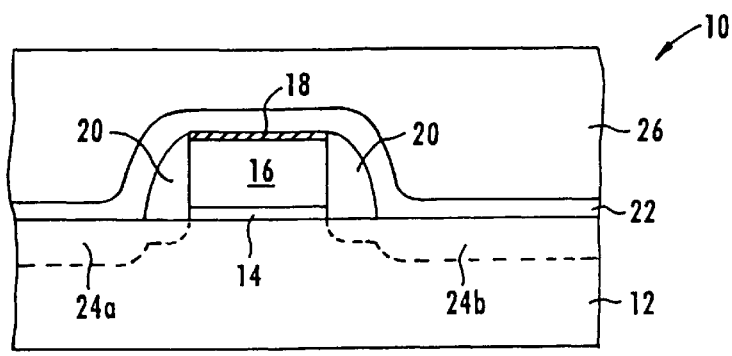
FIG. 1 depicts a cross-section of a portion of a prior-art semiconductor wafer that has a stop layer, a dielectric layer, and a substrate.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

In accordance with certain embodiments of the present invention, methods and arrangements are provided that significantly reduce punch-through effects during the formation of local interconnects. As part of the present invention, it was recognized that the dielectric spacers, which are typically made of silicon dioxide or a similarly deposited oxide material and used during the formation of the source and drain regions within the substrate, can lead to over-etching or punch-through into the substrate during the etching of the overlying dielectric and stop layers. Thus, in accordance with the present invention, multipurpose spacers 100 are formed with a silicon oxime material. The multipurpose spacers 100 take advantage of silicon oxime's properties to provide improved corner selectivity during the local interconnect etching process. When compared to conventional oxide spacers, silicon oxime eliminates, or substantially reduces, the chances of over-etching or punching through into the underlying structure, and/or removing excess amounts of dielectric layer 26 (see FIG. 1). Unlike many conventional nitride spacers, the multipurpose spacers 100 do not need to be removed following the formation of the source and drain regions, because the silicon oxime material in the multipurpose spacers 100 does not tend to degrade the hot carrier injection (HCI) properties as quickly as would a comparative silicon nitride spacer. This advantageous and unexpected result, therefore, makes the multipurpose spacer 100 of the present invention an acceptable replacement for a conventional oxide spacer 20, and there is no need to remove multipurpose spacer 100 following formation of source and drain regions 24a and 24b. Consequently, the multipurpose spacers 100 of the present invention increase the process control during the local interconnect etching process, resulting in a higher yield without significantly affecting the HCI properties of the devices.

Figure 2A:
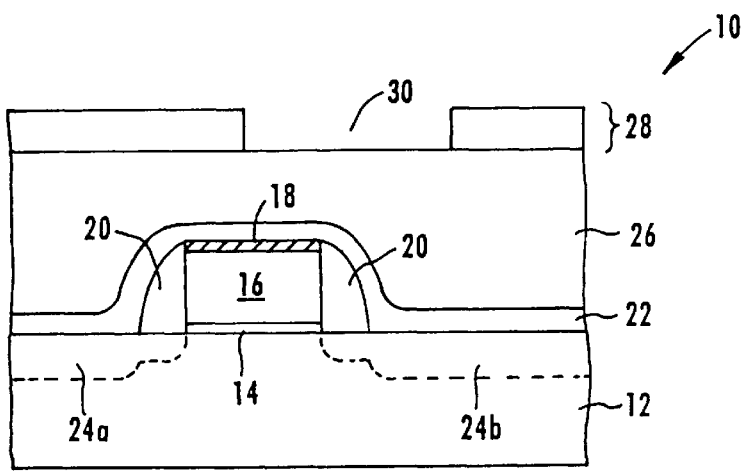
FIG. 2a depicts the portion in FIG. 1 having a patterned resist mask formed thereon for use in forming an etched opening that can be filled to create a local interconnect.
Figure 2B:
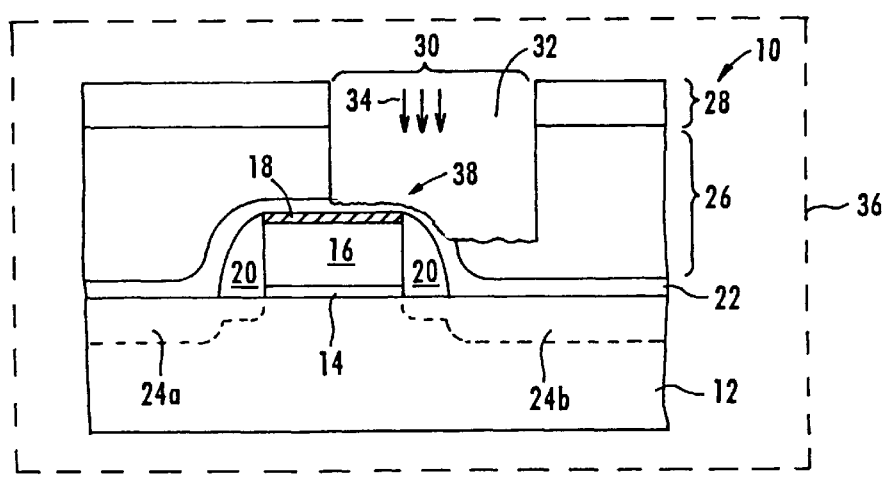
FIG. 2b depicts the portion of FIG. 2a during a dielectric layer etching process in which an initial etched opening is formed.
Figure 2C:
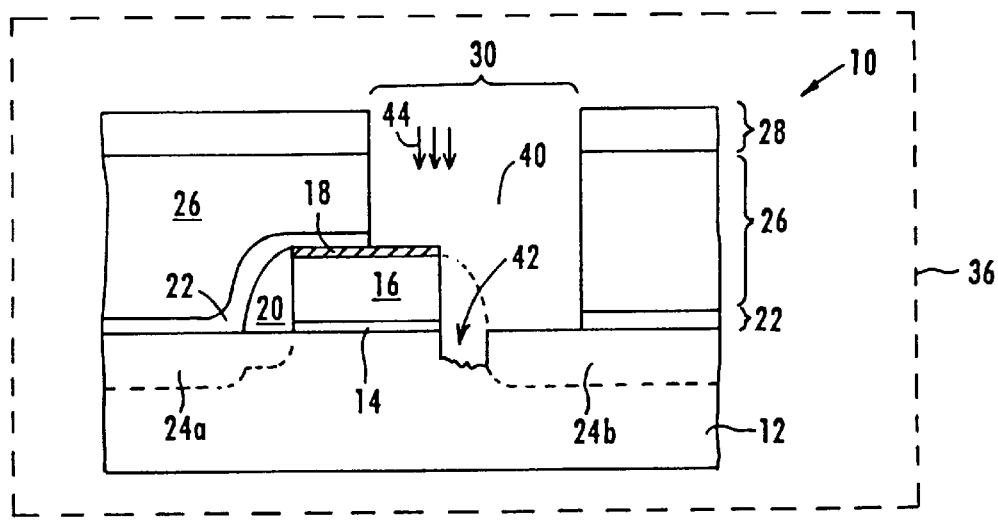
FIG. 2c depicts the portion of FIG. 2b that has a deleterious punch-through region that extends into the substrate following a dielectric layer etching process and a stop layer etching process.

FIGS. 2a through 2c show the prior art portion 10 of FIG. 1 before, during and following, respectively, dielectric layer and stop layer etching processes. In FIG. 2a, a patterned resist mask has been formed over dielectric layer 26. Patterned resist mask 28 has an etch window 30 that exposes a portion of dielectric layer 26. In FIG. 2b, portion 10 has been placed within an etching tool 36 and a dielectric layer etching process has started removing portions of dielectric layer 26 located below etch window 30 to form initial etched opening 32. For example, etching tool 36 can be a plasma-based etching tool that exposes portion 10 to anisotropically etching plasma 34. Even assuming that plasma 34 has a high selectivity between dielectric layer 26 and underlying stop layer 22 as is preferred, portions of stop layer 22 are usually nonetheless removed when exposed to plasma 34.

As shown in FIG. 2b, the higher portions of stop layer 22, which are located below etch window 30 and above gate 16/silicide 18 and spacer 20, are exposed to plasma 34 for the longest period of time. These higher portions, and in particular the comer region 38 of stop layer 22, can be breached (e.g., etched away) during the dielectric layer etching process which exposes the underlying materials to plasma 34. If comer region 38 is etched away, then the material of underlying spacer 20 is exposed to plasma 34. As such, portions of spacer 20 may be etched away.

The material of spacer 20 is typically formed from a thin film of silicon dioxide or a like oxide material. Plasma 34 often etches away all or part of spacer 20 during the dielectric layer etching process, especially if dielectric layer 26 is a similar oxide material. When the critical dimensions are decreased, such that the aspect ratio of the etched opening is increased, it is possible to remove most or all of spacer 20 during the dielectric layer etching process and thereby expose substrate 12 to plasma 34. As mentioned, spacer 20 tends also to be very thin which can worsen the problem. For example, spacer 20 in certain arrangements is approximately 500 to 700 Å thick.

As mentioned above, spacer 20 can also be made of silicon nitride. However, it has been found that a nitride spacer can severely degrade the HCI properties of the device. Thus, while nitride spacers can help to reduce the potential for punch-through or over-etching in some devices, the silicon nitride spacer will need to be removed, otherwise the resulting device tends to have a shortened operational life span.

In FIG. 2c, the dielectric layer etching process has been completed and the portion of stop layer 22 below etch window 30 has been anisotropically etched away in etching tool 36 using a second plasma 44. Consequently, an etched opening 40 is thereby created that extends through dielectric layer 26 and stop layer 22 to expose selected portions of substrate 12 and gate 16/silicide 18. Etched opening 40 can then be filled with one or more conductive materials to form a local interconnect.

As shown, however, there is a punch-through region 42 that extends into substrate 12. Punch-through region 42 has been formed by etching into substrate 12 with either plasma 34 and/or second plasma 44. For example, as described above, punch-through region 42 can form during the dielectric etching process in which plasma 34 etches through corner region 38, spacer 20 and into substrate 12. The subsequent stop layer etching process can further cause and/or increase punch-through region 42.

Punch-through region 42 is deleterious because the active and/or other regions formed within substrate 12 can be damaged. For example, the interface between drain region 24b can be damaged and/or the conductive and/or resistive properties of the various regions can be significantly altered (e.g., punch-through region 42 can lead to unacceptable leakage currents).

The methods and arrangements of the present invention substantially reduce the chances of over-etching into substrate 12 by providing multipurpose spacers 100. In accordance with the present invention, etching chemistries are selected, as is known in the art, to provide a high-selectivity between dielectric layer 26 and the silicon oxime material of multipurpose spacers 100. Consequently, the chances of over-etching and forming a forming punch-through region 42 are significantly reduced, if not eliminated, in most local interconnect formation processes.

Figure 3A:
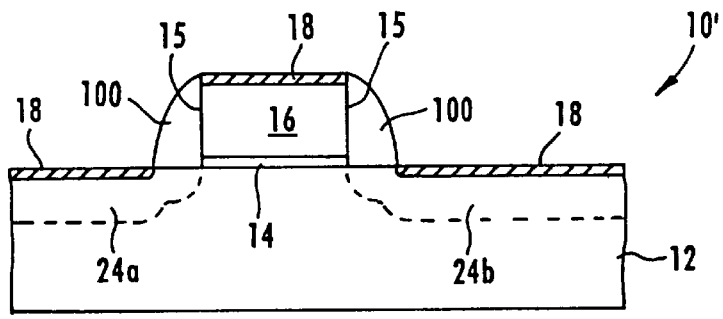
FIG. 3a depicts a cross-section of a portion of a semiconductor wafer having a substrate, a gate arrangement, and multipurpose spacers, in accordance with one embodiment of the present invention.

With this in mind, FIG. 3a depicts an improved portion 10' of a semiconductor wafer, in accordance with an exemplary embodiment of the present invention. Portion 10' is similar to portion 10 in FIG. 1 and like referenced elements are the same. Source and drain regions 24a–b have been formed within substrate 12 using gate 16 and multipurpose spacers 100 as a mask, and silicide 18 has been formed on gate 16 and source and drain regions 24a–b. Multipurpose spacers 100 can be formed using conventional techniques, such as, for example, using conventional film deposition techniques and anisotropically etching the deposited film to leave multipurpose spacers 100 in place along the sidewalls 15 of gate 16.

As mentioned above, multipurpose spacers 100 are preferably made from a film of silicon oxime (e.g., Si(1-x-y-z)NxOy:Hz. Silicon oxime, which is described in more detail in co-pending U.S. patent application Ser. No. 08/479,718, filed Jun. 7, 1995, now U.S. Pat. No. 5,710,067 differs structurally from silicon oxynitride material in that the silicon atoms are bonded directly to the nitrogen atoms, while the oxygen atoms are bonded to the nitrogen atoms. Thus, in silicon oxime, there is essentially no bonding between silicon and oxygen atoms as characterized by the formula Si(1-x-y-z)NxOy:Hz. By way of example, silicon oxime can be produced by reacting source gases for the components (i.e., silicon, nitrogen, oxygen, and hydrogen), under dynamic (e.g., non-equilibrium) conditions employing a stoichiometric excess amount of nitrogen, sufficient to substantially prevent oxygen atoms from reacting with silicon atoms. For example, in one embodiment, the concentration of nitrogen is at least ten times greater than the concentration of oxygen during the reaction within a conventional PECVD reactor, such as that typically used to deposit silicon oxynitride.

Figure 3B:
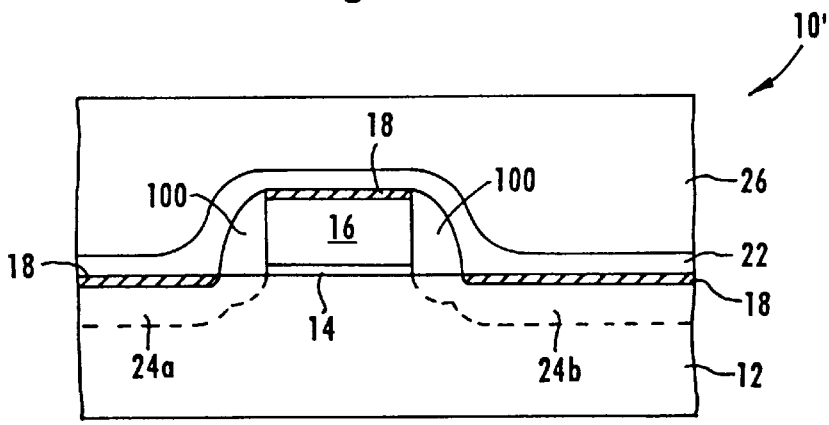
FIG. 3b depicts the portion of FIG. 3a following deposition of a stop layer and a dielectric layer, in accordance with one embodiment of the present invention.

As seen in FIG. 3b, a conformal stop layer 22 is formed on substrate 12/silicide 18, gate 16/silicide 18, and multipurpose spacers 100. For example, stop layer 22 can be a thin film of silicon nitride. Preferably, stop layer 22 is not made of silicon oxime to prevent over-etching and/or punch-through during the etching of stop layer 22 during local interconnect formation. Dielectric layer 26 is then formed over stop layer 22. For example, stop layer 22 and dielectric layer 26 can be formed using conventional deposition techniques (e.g., CVD, PECVD, and the like). FIG. 3b depicts portion 10' having stop layer 22 and dielectric layer 26. Portion 10' in FIG. 3b is similar to portion 10 in FIG. 1, except that each spacer 20 has been replaced by a multipurpose spacer 100.

The term multipurpose in multipurpose spacer 100 is intended to point out that multipurpose spacer 100 not only serves as a masking element during the alignment/formation of source and/or drain regions 24a and 24b, but also serves essentially as a "backup stop layer" to prevent over-etching and possible punch-through during the etching of dielectric layer 26. Multipurpose spacers 100, in certain embodiments, further serve as a stopping mechanism during the subsequent etching of stop layer 22 provided plasma 44 has a high selectivity between the dielectric material in stop layer 22 and the silicon oxime material in multipurpose spacers 100. In certain embodiments, multipurpose spacers 100 serve to protect the HCI properties of the transistor arrangement by separating stop layer 22, which in certain embodiments includes silicon nitride, from the overlapping areas of the gate conductor 16 and source and drain regions 24a and 24b.

Figure 3C:
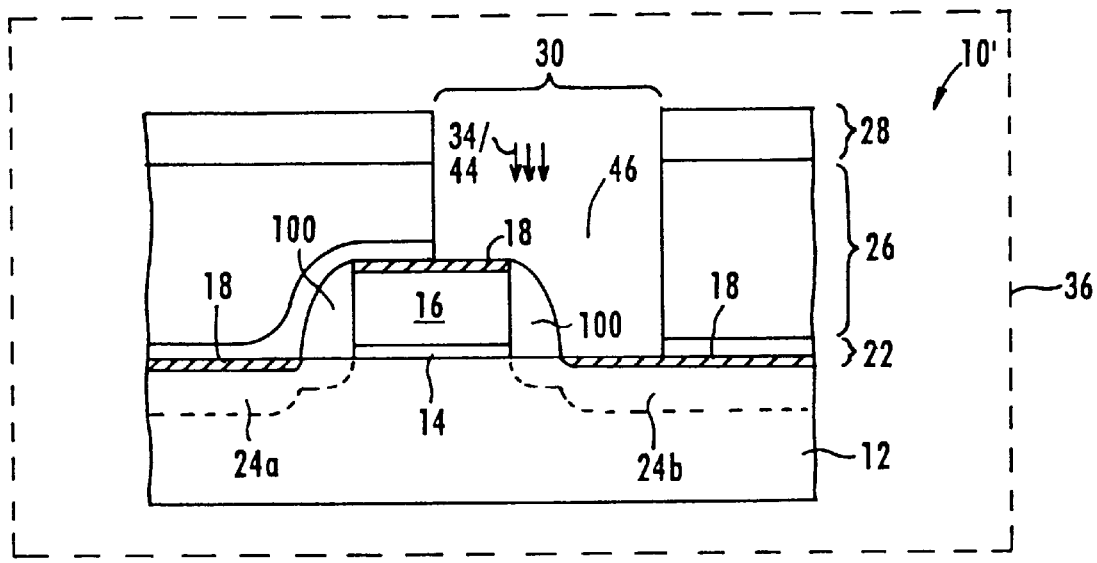
FIG. 3c depicts the portion of FIG. 3b having an etched opening that does not include a punch-through region as a result of a dielectric layer etching process and a stop layer etching process due to the multipurpose spacer provided in accordance with the present invention.

As depicted in FIG. 3c, an etched opening 46 has been formed within at least one etching toot 36 using plasma 34 and second plasma 44, as described above. Etched opening 46 was formed through etch window 30 and extends through dielectric layer 26 and stop layer 22 to reveal portions of the underlying materials, such as gate 16/silicide 18, multipurpose spacer 100 and substrate 12/silicide 18. As shown, the underlying materials, and in particular substrate 12 has not been over-etched and there is no punch-through region as in the prior art.

In certain other embodiments of the present invention, stop layer 22 also comprises silicon oxime. As such, when stop layer 22 is etched through, a portion of the multipurpose spacers 100 will also be removed, thereby resulting in multipurpose spacers 100 that are typically narrower and shorter than those depicted in FIG. 3c.

In still other embodiments of the present invention, multipurpose spacers 100 can be formed over other spacers, for example, to produce a multiple spacer arrangement. Thus, for example, a narrow silicon dioxide spacer can be formed between multipurpose spacer 100 and gate 16, wherein, multipurpose spacer 100 preferably covers the exposed surfaces of the encapsulated silicon dioxide spacer.

Figure 4:
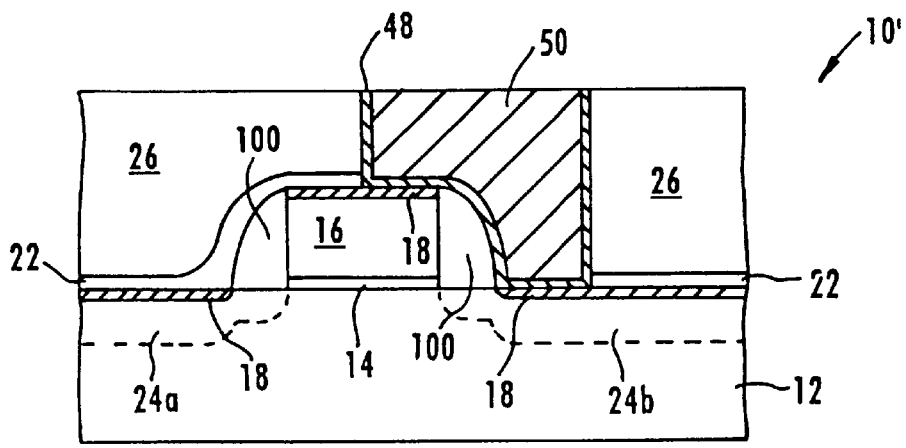
FIG. 4 depicts the portion of FIG. 3c following formation of a local interconnect within the etched opening.

After resist mask 28 has been stripped away, etched region 46 is filled with one or more conductive materials to form a local interconnect. In FIG. 4, portion 10' is depicted as having a glue layer 48 and a plug material 50, which are each conductive, within etched region 46. For example, in one embodiment, glue layer 48 includes titanium/titanium nitride (Ti/TiN) and plug material 50 includes tungsten (W). As shown in FIG. 4, portion 10' has been planarized and/or polished, for example, using conventional chemical-mechanical polishing (CMP) techniques.

In an exemplary embodiment of the present invention, substrate 12 includes a heavily-doped silicon substrate wafer that is approximately 2 mm thick and on which there is grown a lightly-doped epitaxial (epi) layer that is approximately 4 $\mu$m thick. Gate oxide 14 is silicon dioxide that is approximately 55 Å thick. Gate 16, which is preferably made of doped polysilicon, is approximately 1,700 Å thick. In one preferred embodiment, silicide 18 is a titanium-silicide layer that is approximately 700 Å thick. Stop layer 22 is a silicon nitride layer approximately 800 Å thick. Dielectric layer 26 is a TEOS oxide layer approximately 12000 Å thick when deposited and approximately 6500 to 9500 Å thick following planarization.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor device arrangement comprising:
    a substrate having source and drain regions formed therein; and
    a gate arrangement formed on the substrate, the gate arrangement including a gate conductor and at least one spacer that contacts the gate conductor and the substrate, wherein the spacer includes silicon oxime.

2. The semiconductor device arrangement as recited in claim 1, wherein the gate arrangement further comprises a silicon dioxide film between the gate conductor and the substrate, the silicon dioxide film being formed on the substrate.

3. The semiconductor device arrangement as recited in claim 2, wherein the gate conductor comprises polysilicon.

4. The semiconductor device arrangement as recited in claim 3, wherein the gate conductor further comprises silicide.

5. The semiconductor device arrangement as recited in claim 1, further comprising two separate spacers, each of which contacts the gate conductor and the substrate at different locations, and a stop layer made of a second dielectric material that covers at least a portion of the substrate and at least a portion of the gate arrangement.

6. The semiconductor device arrangement as recited in claim 5, wherein the second dielectric material of the stop layer is different from the dielectric material of the spacer.

7. The semiconductor device arrangement as recited in claim 6, wherein the stop layer comprises silicon nitride.

8. The semiconductor device arrangement as recited in claim 5, further comprising a dielectric layer that is formed on at least a portion of the stop layer.

9. The semiconductor device arrangement as recited in claim 8, wherein the dielectric layer comprises TEOS oxide.

10. The semiconductor device arrangement as recited in claim 8, further comprising a local interconnect that contacts and extends through the dielectric layer and electrically contacts at least a portion of the substrate, and wherein the local interconnect comprises an electrically conductive material.

11. The transistor arrangement as recited in claim 10, wherein the local interconnect comprises tungsten (W).

12. A multipurpose spacer for use in a semiconductor device, the multipurpose spacer comprising silicon oxime.

13. A method for forming a semiconductor device having at least one local interconnect, the method comprising:
    forming a gate arrangement on a substrate, the gate arrangement including a gate conductor and at least one spacer that contacts the gate conductor and the substrate, wherein the spacer includes silicon oxime;
    forming a source region and a drain region within the substrate, wherein at least a portion of the gate arrangement overlaps a portion of the source region and a portion of the drain region; and
    forming at least one dielectric layer over the gate arrangement, the source region and the drain region, and removing selected portions of the at least one dielectric layer to form at least one etched opening that extends through the at least one dielectric layer to expose at least a portion at least one of the underlying source region, drain region and gate arrangement.

14. The method as recited in claim 13, further comprising forming a local interconnect by filling the etched opening with an electrically conductive material, such that the local interconnect electrically contacts the exposed at least one of the underlying source region, drain region and gate arrangement.

15. The method as recited in claim 14, wherein the local interconnect comprises tungsten (W).

16. The method as recited in claim 13, wherein the gate arrangement further comprises a silicon dioxide film between the gate conductor and the substrate, the silicon dioxide film being formed on the substrate.

17. The method as recited in claim 16, wherein the gate conductor comprises polysilicon.

18. The method as recited in claim 17, wherein the gate conductor further comprises silicide.

19. The method as recited in claim 13, wherein the at least one dielectric layer includes a first dielectric layer formed on the gate arrangement, the source region and the drain region, and a second dielectric layer formed on the first dielectric layer, and wherein the first dielectric layer acts as a stop layer during removal of the overlying second dielectric layer, and the first and second dielectric layers comprise are made of different dielectric materials.

20. The method as recited in claim 19, wherein the first dielectric material includes silicon nitride and the second dielectric material includes TEOS oxide.

* * * * *